(12) United States Patent
Sakuragi et al.

(10) Patent No.: US 7,521,747 B2
(45) Date of Patent: Apr. 21, 2009

(54) VERTICAL TRANSISTOR AND A SEMICONDUCTOR INTEGRATED CIRCUIT APPARATUS HAVING THE SAME

(75) Inventors: Masahiro Sakuragi, Kyoto (JP); Masahiko Sonoda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 250 days.

(21) Appl. No.: 11/116,357

(22) Filed: Apr. 28, 2005

(65) Prior Publication Data
US 2005/0253174 A1   Nov. 17, 2005

(30) Foreign Application Priority Data
Apr. 30, 2004   (JP) ............... 2004-136572

(51) Int. Cl.
*H01L 27/108*   (2006.01)
*H01L 29/76*   (2006.01)
*H01L 29/94*   (2006.01)
*H01L 31/119*   (2006.01)

(52) U.S. Cl. ............... 257/302; 257/288; 257/401
(58) Field of Classification Search ............... 257/288, 257/401, 901, 302
See application file for complete search history.

(56) References Cited

U.S. PATENT DOCUMENTS

| | | | |
|---|---|---|---|
| 4,783,694 A * | 11/1988 | Merrill et al. ............ | 257/337 |
| 5,155,562 A * | 10/1992 | Tsuchiya ............ | 257/343 |
| 5,502,317 A | 3/1996 | Duvvury | |
| 5,844,280 A | 12/1998 | Kim | |
| 6,914,298 B1 * | 7/2005 | Hamazawa ............ | 257/343 |
| 2001/0025961 A1 | 10/2001 | Nakamura et al. | |
| 2004/0119120 A1 | 6/2004 | Nishikawa et al. | |
| 2005/0082619 A1 * | 4/2005 | Wu et la. ............ | 257/361 |

FOREIGN PATENT DOCUMENTS

| | | |
|---|---|---|
| JP | 09-036357 | 2/1997 |
| JP | 10-084046 | 3/1998 |
| JP | 2001320047 | 11/2001 |
| JP | 2003218348 | 7/2003 |

OTHER PUBLICATIONS

Foreign Office Action, Application No. 2004-136572, issued on Jun. 3, 2008.

* cited by examiner

*Primary Examiner*—Monica Lewis
(74) *Attorney, Agent, or Firm*—Rabin & Berdo, PC

(57) ABSTRACT

AMOS transistor comprises: a first conduction type region; a second conduction type drain region formed on the outermost layer portion of the first conduction type region; a second conduction type source region formed on the outermost layer portion of the first conduction type region with a channel region provided between the second conduction type drain region and the second conduction type source region; agate electrode formed on the channel region; a second conduction type base region formed inside of the second conduction type drain region in plan elevation; a plurality of first conduction type emitter regions formed in the second conduction type base region on the outermost layer portion thereof at spatial intervals in a predetermined direction; and a drain contact connected to, as lying astride, adjacent two first conduction type emitter regions and that portion of the second conduction type drain region between these adjacent two first conduction type emitter regions.

8 Claims, 4 Drawing Sheets

VERTICAL TRANSISTOR AND A SEMICONDUCTOR INTEGRATED CIRCUIT APPARATUS HAVING THE SAME

BACKGROUND OF THE INVENTION

1. Field of the Invention

The present invention relates to a MOS transistor having an electrostatic protection function, and also relates to a semiconductor integrated circuit apparatus having this MOS transistor.

2. Description of Related Art

In an input/output circuit of an integrated circuit (IC), a MOS transistor having an electrostatic protection function is used in order to prevent an electrostatic breakdown caused by an electrostatic surge applied to the input or output terminal.

FIG. 6 is a section view schematically showing the structure of a conventional NMOS transistor having an electrostatic protection function. FIG. 7 is an equivalent circuit diagram of the NMOS transistor shown in FIG. 6.

The NMOS transistor in FIG. 6 is separated, as an element, by a field oxide film 62 formed on the surface of a P-type semiconductor substrate 61. This NMOS transistor is provided on the outermost layer portion of the P-type semiconductor substrate 61 with an $N^+$-type (high concentration N type) drain region 63, an annular $N^+$-type source region 64 surrounding the periphery of the $N^+$-type drain region 63 with a predetermined distance provided between the $N^+$-type drain region 63 and the $N^+$-type source region 64, an annular $N^-$-type (low concentration N type) impurity region 65 surrounding the $N^+$-type drain region 63 adjacent to the outer periphery thereof, and an annular $P^+$-type (high concentration P type) impurity region 66 surrounding the $N^+$-type source region 64 adjacent to the outer periphery thereof. A LOCOS 67 is formed on the $N^-$-type impurity region 65. A gate oxide film 68 is formed in the channel region between the $N^+$-type source region 64 and the $N^-$-type impurity region 65. The inner peripheral portion of the gate oxide film 68 is positioned on the LOCOS 67. A gate electrode 69 is formed on the gate oxide film 68, and a drain electrode, a source electrode and a backgate electrode are respectively connected to the $N^+$-type drain region 63, the $N^+$-type source region 64 and the $P^+$-type impurity region 66.

In the structure above-mentioned, parasitic resistance components 71, 72 are respectively generated in the P-type semiconductor substrate 61 and the $N^-$-type impurity region 65. Further, the $N^-$-type impurity region 65, the P-type semiconductor substrate 61 and the $N^+$-type source region 64, form an NPN-type parasitic transistor 73 with the $N^-$-type impurity region 65, the P-type semiconductor substrate 61 and the $N^+$-type source region 64 respectively serving as a collector, a base and an emitter. Further, a PN junction by the P-type semiconductor substrate 61 and the $N^+$-type drain region 63 forms a parasitic diode 74.

For example, when the NMOS transistor shown in FIG. 6 is used in an output circuit, the gate electrode 69 is connected to an internal circuit, and an output terminal is connected to the drain electrode with both the source electrode and the backgate electrode grounded. In such a case, a negative electrostatic surge applied to the output terminal, is escaped through the parasitic diode 74 with the NMOS transistor turned OFF. However, even though a positive electrostatic surge is applied to the output terminal, the NMOS transistor and the parasitic transistor 73 remain OFF. Accordingly, there is no route through which the positive electrostatic surge is escaped. Therefore, when a positive electrostatic surge exceeding the electrostatic breakdown voltage of the NMOS transistor, is applied to the output terminal (drain electrode), the NMOS transistor is broken at its part between the drain and the gate or between the drain and the source.

SUMMARY OF THE INVENTION

It is an object of the present invention to provide a MOS transistor having the structure capable of preventing an electrostatic breakdown caused by an electrostatic surge which cannot be escaped through a parasitic diode, and also to provide a semiconductor integrated circuit apparatus provided in its input/output circuit with this MOS transistor.

A MOS transistor according to the present invention comprises: a first conduction type region; a second conduction type drain region formed on the outermost layer portion of the first conduction type region; a second conduction type source region formed on the outermost layer portion of the first conduction type region with a channel region provided between the second conduction type drain region and the second conduction type source region; agate electrode formed on the channel region; a second conduction type base region formed inside of the second conduction type drain region in plan elevation; a plurality of first conduction type emitter regions formed in the second conduction type base region on the outermost layer portion thereof at spatial intervals in a predetermined direction; and a drain contact connected to, as lying astride, adjacent two first conduction type emitter regions and that portion of the second conduction type drain region between these adjacent two first conduction type emitter regions.

According to the arrangement above-mentioned, in the first conduction type emitter regions, the second conduction type base region and the first conduction type region, there is formed a vertical transistor with these regions respectively serving as an emitter, a base and a collector. Further, in the second conduction type drain region, the first conduction type region and the second conduction type source region, there is formed a parasitic transistor with these regions respectively serving as a collector, a base and an emitter. Further, there is generated, in the second conduction type drain region, a parasitic resistance component serving as a resistance across the emitter and the base of the vertical transistor, and there is generated, in the first conduction type region, a parasitic resistance component serving as a resistance across the emitter and the base of the parasitic transistor.

When a positive/negative electrostatic surge (a positive electrostatic surge for an NMOS transistor and a negative electrostatic surge for a PMOS transistor), is applied to the drain contact, an electric current flows, toward the gate electrode, in the second conduction type drain region having a parasitic resistance component. This generates a potential difference between the emitter and the base of the vertical transistor. When the potential difference between the emitter and the base, is not less than a predetermined value, the vertical transistor is conducted. As a result, the parasitic transistor is conducted, enabling the electrostatic surge applied to the drain contact to be escaped.

The potential difference generated between the emitter and the base of the vertical transistor, can be controlled by the resistance value of the parasitic resistance component (which serves as a resistance across the emitter and the base of the vertical transistor) generated in the second conduction type drain region. Accordingly, as far as the parasitic resistance component has a suitable resistance value, the vertical transistor can securely be conducted to prevent an electrostatic breakdown across the drain and the gate of the MOS transistor or across the drain and the source of the MOS transistor, when an electrostatic surge is applied to the drain contact.

The resistance value of the parasitic resistance component generated in the second conduction type drain region, is determined by a parameter of which examples include the concentration of the second conduction type impurity of the second conduction type drain region, the distance between adjacent two first conduction type emitter regions, and the width between that end edge of the drain contact in the direction at right angles to the predetermined direction and that end edge of each first conduction type emitter region in the direction at right angles to the predetermined direction. Accordingly, by properly setting the parameter, a potential difference not less than a predetermined value can be generated between the emitter and the base of the vertical transistor to enable the vertical transistor to be securely conducted, when an electrostatic surge is applied to the drain contact.

For example, the concentration of the second conduction type impurity in the second conduction type drain region, is preferably controlled such that a potential difference not less than a predetermined value is generated between the second conduction type base region and the first conduction type emitter regions connected to the drain contact when an electrostatic surge is applied to the drain contact. By such an arrangement, the vertical transistor can securely be conducted.

Preferably, the distance between adjacent two first conduction type emitter regions, is set such that a potential difference not less than a predetermined value is generated between the second conduction type base region and the first conduction type emitter regions connected to the drain contact when an electrostatic surge is applied to the drain contact. By such an arrangement, too, the vertical transistor can securely be conducted.

Preferably, the width between that end edge of the drain contact in the direction at right angles to the predetermined direction and that end edge of each first conduction type emitter region in the direction at right angles to the predetermined direction, is set such that a potential difference not less than a predetermined value is generated between the second conduction type base region and the first conduction type emitter regions connected to the drain contact when an electrostatic surge is applied to the drain contact. By such an arrangement, too, the vertical transistor can securely be conducted.

A semiconductor integrated circuit apparatus according to the present invention is provided, in its input/output circuit having an input/output terminal, with a MOS transistor of the type above-mentioned. The MOS transistor of the type above-mentioned can escape an electrostatic surge applied to the drain contact. Accordingly, when the MOS transistor is used in an input/output circuit, an electrostatic surge applied to the input/output terminal can securely be escaped. This enables the internal circuit to be securely protected from such an electrostatic surge.

The foregoing and other elements, features, steps, characteristics and advantages of the present invention will become more apparent from the following detailed description of the preferred embodiments with reference to the attached drawings.

DESCRIPTION OF THE PREFERRED EMBODIMENTS

Figure 1:
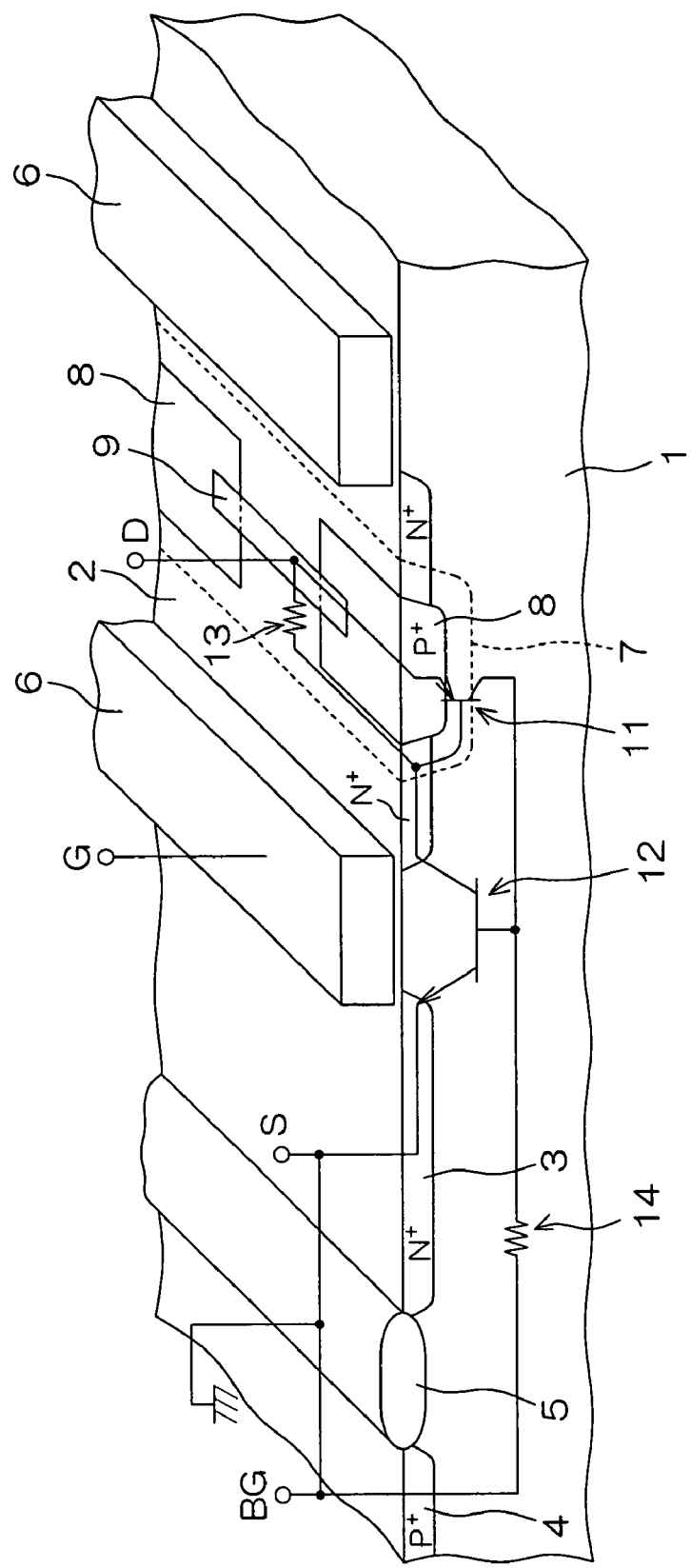
FIG. 1 is a perspective view schematically illustrating the structure of an NMOS transistor according to a preferred embodiment of the present invention.
Figure 2:
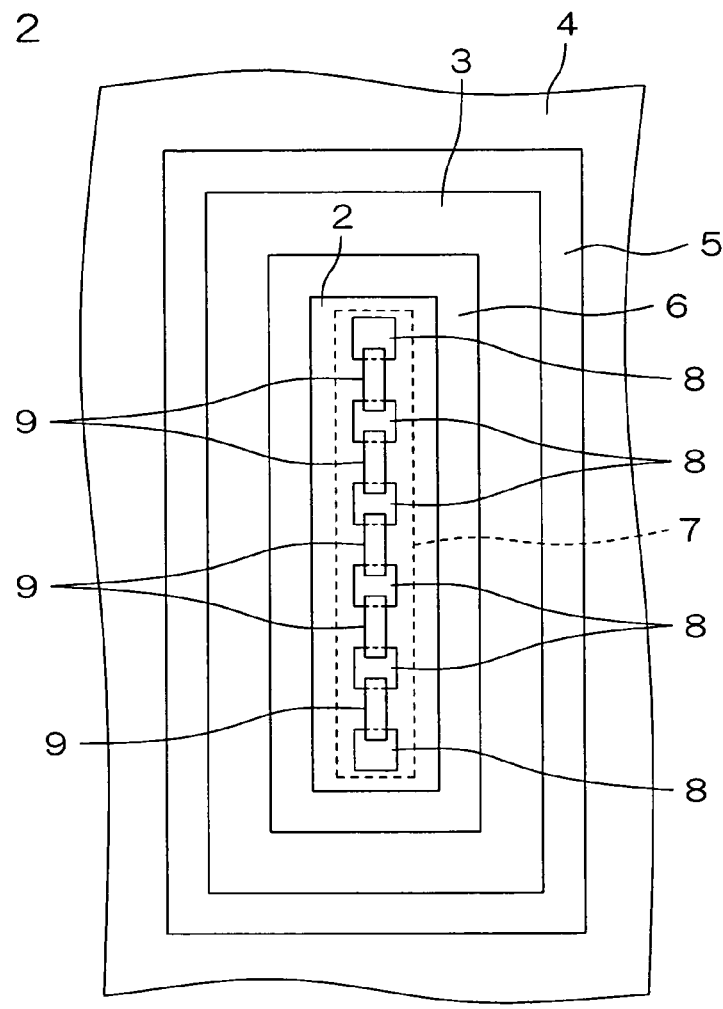
FIG. 2 is a plan view of the NMOS transistor shown in FIG. 1.
Figure 3:
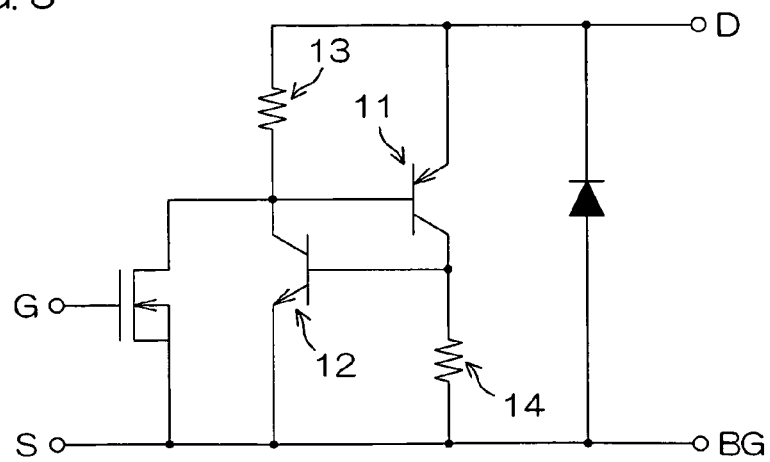
FIG. 3 is an equivalent circuit diagram of the NMOS transistor shown in FIG. 1.

FIG. 1 is a perspective view schematically illustrating the structure of an NMOS transistor according to a preferred embodiment of the present invention. FIG. 2 is a plan view of the NMOS transistor shown in FIG. 1, and FIG. 3 is an equivalent circuit diagram of the NMOS transistor shown in FIG. 1.

The NMOS transistor is provided on the outermost layer portion of a P-type well region 1 with (i) an $N^+$-type (high concentration N type) drain region 2 which is substantially rectangular in plan elevation, (ii) an $N^+$-type source region 3 which is substantially in the form of a quadrilateral frame in plan elevation and which surrounds the periphery of the $N^+$-type drain region 2 with a predetermined distance provided between the $N^+$-type drain region 2 and the $N^+$-type source region 3, and (iii) a $P^+$-type impurity diffusion region 4 which is substantially in the form of a quadrilateral frame in plan elevation and which surrounds the periphery of the $N^+$-type source region 3 with a predetermined distance provided between the $N^+$-type source region 3 and the $P^+$-type impurity diffusion region 4. A source electrode S and a back-gate electrode BG are respectively connected to the $N^+$-type source region 3 and the $P^+$-type impurity diffusion region 4.

Formed on the surface of the P-type well region 1 between the $N^+$-type source region 3 and the $P^+$-type impurity diffusion region 4 is a LOCOS 5, which separates the $N^+$-type source region 3 from the $P^+$-type impurity diffusion region 4. A gate electrode 6, substantially in the form of a quadrilateral frame in plan elevation, is formed on the channel region between the $N^+$-type drain region 2 and the $N^+$-type source region 3. A gate oxide film (not shown) is formed under the gate electrode 6.

An N-type base region 7, substantially rectangular in plan elevation, is formed in the $N^+$-type drain region 2 at its center portion in plan elevation, this N-type base region 7 being deeply dug down from the peripheral $N^+$-type drain region 2. In the N-type base region 7, there are formed, on its outermost layer portion, a plurality of $P^+$-type emitter regions 8 arranged longitudinally of the N-type base region 7 substantially at regular spatial intervals. Band-like drain contacts 9 are formed on adjacent $P^+$-type emitter regions 8 and on those portions of the $N^+$-type drain region 2 between these adjacent $P^+$-type emitter regions 8. Each drain contact 9 extends longitudinally of the $N^+$-type drain region 2. Both ends of each drain contact 9 are disposed on the opposite ends of adjacent $P^+$-type emitter regions 8, and are connected to, as lying astride, these adjacent $P^+$-type emitter regions 8 and that portion of the N$^+$-type drain region 2 between these adjacent P$^+$-type emitter regions 8. A drain electrode D is connected to the drain contacts 9.

According to the structure above-mentioned, a PNP junction is formed in the P$^+$-type emitter regions 8, the N-type base region 7 and the P-type well region 1, and a VPNP (vertical PNP) transistor 11 is formed with the P$^+$-type emitter regions 8, the N-type base region 7 and the P-type well region 1 respectively serving as an emitter, a base and a collector. Further, an NPN junction is formed in the N$^+$-type drain region 2, the P-type well region 1and the N$^+$-type source region 3, and an NPN parasitic transistor 12 is formed with the N$^+$-type drain region 2, the P-type well region 1 and the N$^+$-type source region 3 respectively serving as a collector, a base and an emitter. Further, there is generated, in the N$^+$-type drain region 2, a parasitic resistance component 13 serving as an emitter-base resistance of the VPNP transistor 11. There is also generated, in the P-type well region 1, a parasitic resistance component 14 serving as an emitter-base resistance of the NPN parasitic transistor 12. For simplification, FIG. 2 shows the junction of five drain contacts 9. To obtain a better effect, however, it is preferable to dispose 10 or more drain contacts 9.

For example, when this NMOS transistor is used in an output circuit of an integrated circuit (IC), the gate electrode 6 is connected to an internal circuit of the integrated circuit, and the drain electrode D is connected to the output terminal. Further, the source electrode S and the backgate electrode BG are grounded.

In this NMOS transistor, when a positive electrostatic surge is applied to the output terminal, an electric current flows, toward the gate electrode 6, in the N$^+$-type drain region 2 having the parasitic resistance component 13. This generates a potential difference $V_{EB}$ between the emitter and the base of the VPNP transistor 11. When this potential difference $V_{EB}$ between the emitter and the base, is not less than a predetermined potential difference $V_F$, the VPNP transistor 11 is conducted. As a result, the NPN parasitic transistor 12 is conducted, causing a positive electrostatic surge applied to the output terminal to be escaped to the ground. The potential difference $V_{EB}$ generated between the emitter and the base of the VPNP transistor 11, can be controlled by the resistance value of the parasitic resistance component 13. Accordingly, as far as this parasitic resistance component 13 has a suitable resistance value, the VPNP transistor 11 can securely be conducted to prevent an electrostatic breakdown across the drain and the gate of the NMOS transistor or across the drain and the source of the NMOS transistor, when a positive electrostatic surge is applied to the output terminal.

Figure 4:
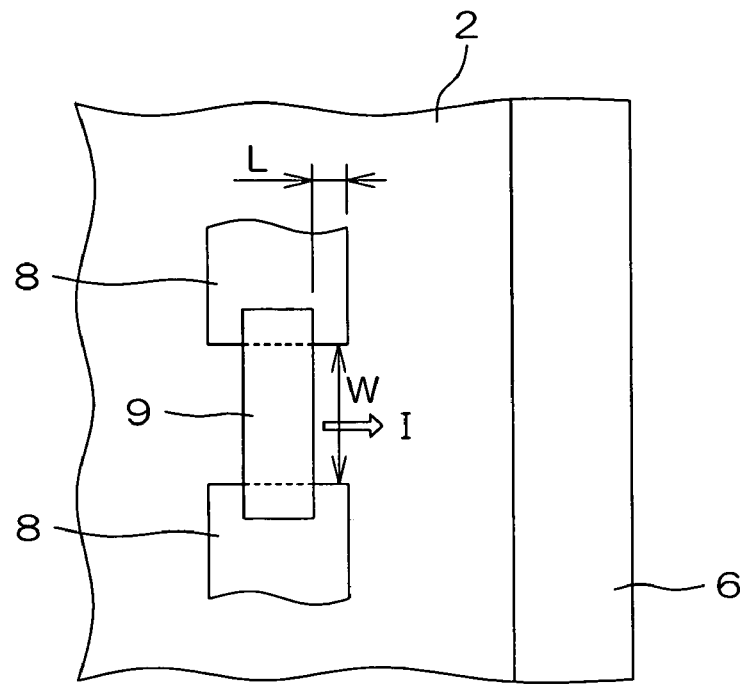
FIG. 4 is a plan view illustrating the vicinity of a drain contact shown in FIG. 2.

The resistance value of the parasitic resistance component 13 is determined according to (i) the N-type impurity concentration of the N$^+$-type drain region 2, (ii) the distance W (See FIG. 4) between adjacent two P$^+$-type emitter regions 8 connected to the same drain contact 9, and (iii) the width L (See FIG. 4) of a rectangular zone adjacent to the drain contact 9 between adjacent two P$^+$-type emitter regions 8. Accordingly, the potential difference $V_{EB}$ generated between the emitter and the base of the VPNP transistor 11, can be controlled by the N-type impurity concentration of the N$^+$-type drain region 2, the distance W between adjacent two P$^+$-type emitter regions 8 and/or the width L of the rectangular zone adjacent to each drain contact 9.

Figure 5:
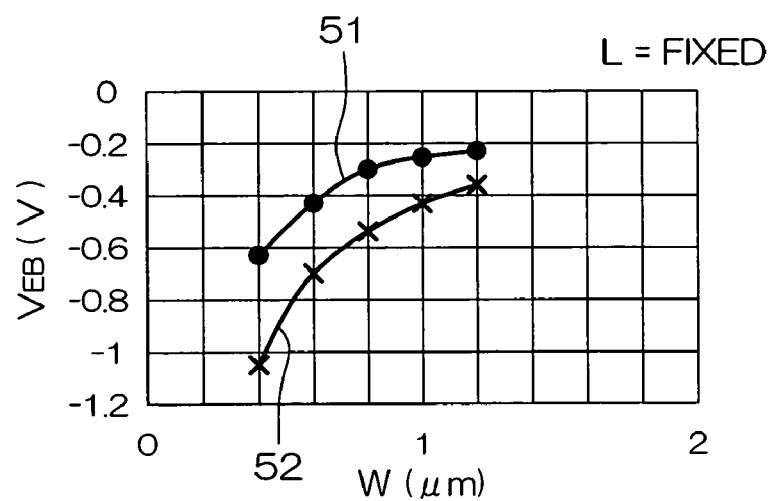
FIG. 5 is a graph illustrating the relationship between the distance between two $P^+$-type emitter regions connected to the same drain contact, and the voltage across the emitter and the base of a VPNP transistor.
Figure 6:
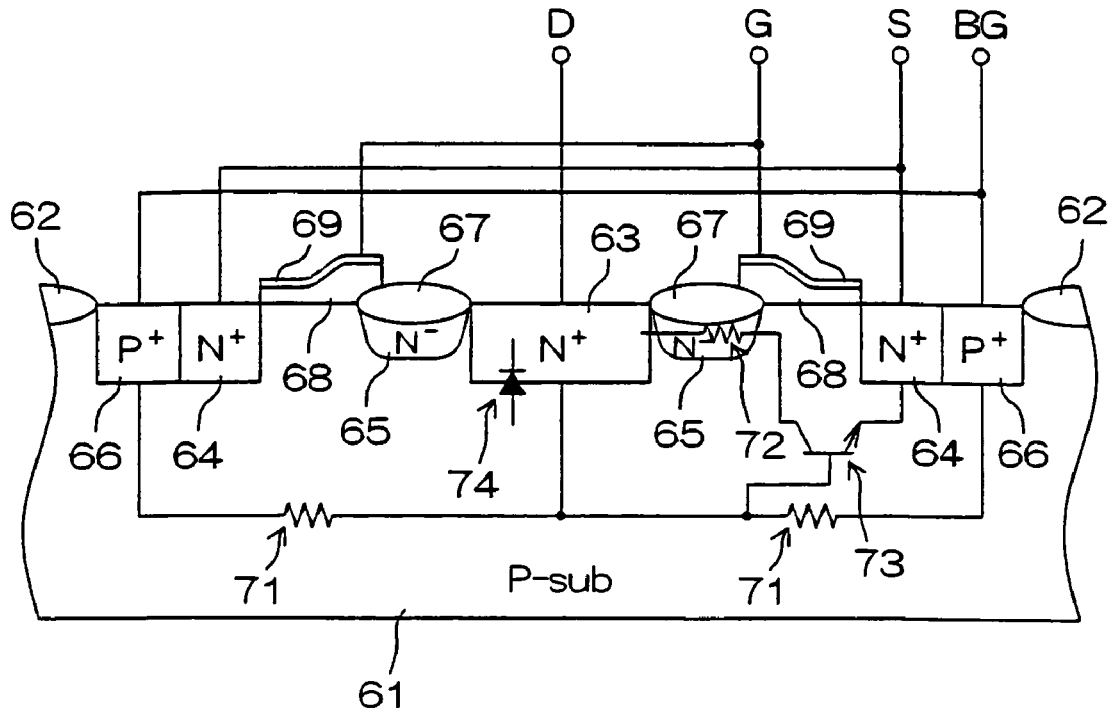
FIG. 6 is a section view schematically illustrating the structure of a conventional NMOS transistor having an electrostatic protection function.
Figure 7:
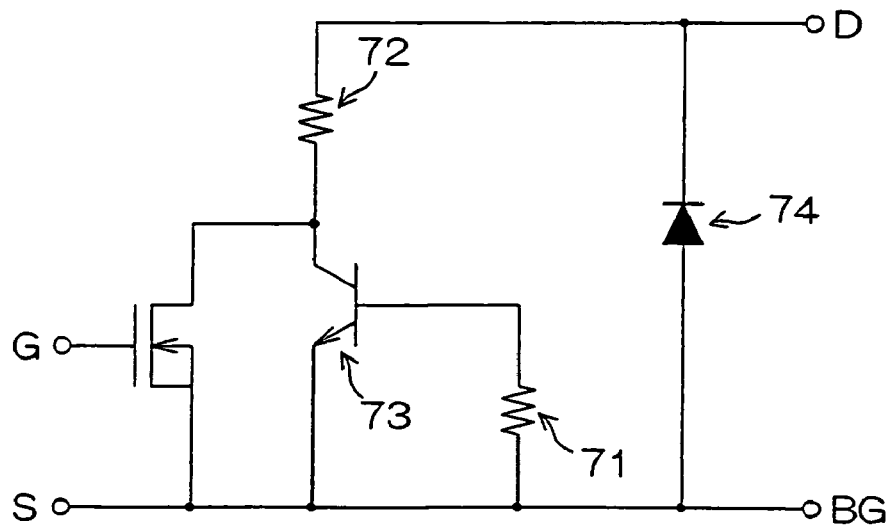
FIG. 7 is an equivalent circuit diagram of the NMOS transistor shown in FIG. 6.

FIG. 5 is a graph illustrating the relationship between the distance W between two P$^+$-type emitter regions 8 connected to the same drain contact 9, and the potential difference $V_{EB}$ (the voltage drop amount in the parasitic resistance component 13) generated between the emitter and the base of the VPNP transistor 11 when an electric current I=0.0125 A flows in the N$^+$-type drain region 2. A curve 51 shows the relationship at the time when the N$^+$-type drain region 2 contains As (arsenic) and P (phosphorus) each having a predetermined concentration (5E20/cm$^3$) (when the impurity concentration is relatively high). A curve 52 shows the relationship at the time when the N$^+$-type drain region 2 contains only As of a predetermined concentration (5E20/cm$^3$) (when the impurity concentration is relatively low).

As shown by the curve 51 in FIG. 5, when the distance W between two P$^+$-type emitter regions 8 connected to the same drain contact 9, is decreased, the potential difference $V_{EB}$ generated between the emitter and the base of the VPNP transistor 11 can be increased when a positive electrostatic surge is applied to the output terminal. For example, it is now supposed that the width L is equal to 0.6 μm. In this case, by setting the distance W to 0.6 μm or less, it is possible to generate the potential difference $V_{EB}$ not less than the predetermined value $V_F$ between the emitter and the base of the VPNP transistor 11 to enable the VPNP transistor 11 to be securely conducted, when a positive electrostatic surge is applied to the output terminal.

Further, as shown by the curve 52, when the N-type impurity concentration in the N$^+$-type drain region 2 is decreased, the potential difference $V_{EB}$ generated between the emitter and the base of the VPNP transistor 11 can be increased when a positive electrostatic surge is applied to the output terminal. For example, it is now supposed that the width L is equal to 0.6 μm and the distance W is equal to 0.9 μm. In this case, by setting the N-type impurity concentration of the N$^+$-type drain region 2 to 5E20/cm$^3$ or less, a potential difference $V_{EB}$ not less than the predetermined value $V_F$, can be generated between the emitter and the base of the VPNP transistor 11 to enable the VPNP transistor 11 to be securely conducted, when a positive electrostatic surge is applied to the output terminal.

In the foregoing, a preferred embodiment of the present invention has been discussed, but the present invention can also be embodied in other manner. For example, in the preferred embodiment above-mentioned, the gate electrode 6 substantially in the form of a quadrilateral frame in plan elevation, is formed on the channel region between the N$^+$-type drain region 2 and the N$^+$-type source region 3. However, the gate electrode 6 may be formed substantially in the U shape in plan elevation, or may linearly extend along the channel region between the N$^+$-type drain region 2 and the N$^+$-type source region 3.

In the preferred embodiment above-mentioned, the N$^+$-type drain region 2, the N$^+$-type source region 3 and the like are formed on the outermost layer portion of the P-type well region 1. However, the N$^+$-type drain region 2, the N$^+$-type source region 3 and the like may be formed on the outermost layer portion of the P-type semiconductor substrate.

Further, the present invention may be applied not only to an NMOS transistor, but also to a PMOS transistor provided, on the outermost layer portion of an N-type well region or an N-type semiconductor substrate, with a P$^+$-type drain region and a P$^+$-type source region. In this case, a P-type base region may be formed in the P$^+$-type drain region at its periphery, and a plurality of N$^+$-type emitter regions may be formed, within the P-type base region, on its outermost layer portion at substantially regular spatial intervals. Each band-like drain contact may be formed on adjacent two N$^+$-type emitter regions and that portion of the P$^+$-type drain region between these adjacent two N$^+$-type emitter regions such that these regions are connected to one another. According to the arrangement above-mentioned, a positive electrostatic surge applied to the drain contacts can be escaped through a parasitic diode, and a negative electrostatic surge applied to the drain contacts can be escaped through a VNPN transistor and a parasitic PNP transistor.

Preferred embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This Application corresponds to Japanese Patent Application No. 2004-136572 filed with the Japanese Patent Office on 30 Apr. 2004, the full disclosure of which is incorporated hereby by reference.

What we claim is:

1. A vertical transistor comprising:
    a first conduction type region;
    a second conduction type drain region formed on the outermost layer portion of the first conduction type region;
    a second conduction type base region formed inside of the second conduction type drain region in plan elevation;
    a plurality of first conduction type emitter regions formed in the second conduction type base region on the outermost layer portion thereof at spatial intervals in a predetermined direction; and
    a drain contact overlying and connected to a pair of the first conduction type emitter regions and overlying and connected to a portion of the second conduction type drain region between the pair of first conduction type emitter regions.

2. The vertical transistor according to claim 1, wherein a concentration of a second conduction type impurity in the second conduction type drain region is controlled such that a potential difference not less than a predetermined value is generated between the second conduction type base region and the pair of first conduction type emitter regions when an electrostatic surge is applied to the drain contact.

3. The vertical transistor according to claim 1, wherein a distance between the pair of first conduction type emitter regions is set such that a potential difference not less than a predetermined value is generated between the second conduction type base region and the pair of first conduction type emitter regions when an electrostatic surge is applied to the drain contact.

4. The vertical transistor according to claim 1, wherein a width between a first end edge of the drain contact in a direction at right angles to the predetermined direction and a second end edge of each first conduction type emitter region in the direction at right angles to the predetermined direction, is set such that a potential difference not less than a predetermined value is generated between the second conduction type base region and the pair of first conduction type emitter regions when an electrostatic surge is applied to the drain contact.

5. A semiconductor integrated circuit apparatus provided in its input/output circuit having an input/output terminal with a vertical transistor, the vertical transistor comprising:
    a first conduction type region;
    a second conduction type drain region formed on the outermost layer portion of the first conduction type region;
    a second conduction type base region formed inside of the second conduction type drain region in plan elevation;
    a plurality of first conduction type emitter regions formed in the second conduction type base region on the outermost layer portion thereof at spatial intervals in a predetermined direction; and
    a drain contact overlying and connected to a pair of the first conduction type emitter regions and overlying and connected to a portion of the second conduction type drain region between the pair of first conduction type emitter regions.

6. The semiconductor integrated circuit apparatus according to claim 5, wherein a concentration of a second conduction type impurity in the second conduction type drain region is controlled such that a potential difference not less than a predetermined value is generated between the second conduction type base region and the pair of first conduction type emitter regions when an electrostatic surge is applied to the drain contact.

7. The semiconductor integrated circuit apparatus according to claim 5, wherein a distance between the pair of first conduction type emitter regions is set such that a potential difference not less than a predetermined value is generated between the second conduction type base region and the pair of first conduction type emitter regions when an electrostatic surge is applied to the drain contact.

8. The semiconductor integrated circuit apparatus according to claim 5, wherein a width between a first end edge of the drain contact in a direction at right angles to the predetermined direction and a second end edge of each first conduction type emitter region in the direction at right angles to the predetermined direction, is set such that a potential difference not less than a predetermined value is generated between the second conduction type base region and the pair of first conduction type emitter regions when an electrostatic surge is applied to the drain contact.

* * * * *